United States Patent
Rho et al.

(10) Patent No.: US 6,862,050 B2
(45) Date of Patent: Mar. 1, 2005

(54) LIQUID CRYSTAL DISPLAYS USING ORGANIC INSULATING MATERIAL FOR A GATE INSULATING LAYER AND/OR HAVING PHOTOLITHOGRAPHIC FORMED SPACERS

(75) Inventors: Soo-Guy Rho, Seoul (KR); Jung-Ho Lee, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/387,278

(22) Filed: Mar. 12, 2003

(65) Prior Publication Data

US 2003/0179325 A1 Sep. 25, 2003

Related U.S. Application Data

(63) Continuation of application No. 09/800,700, filed on Mar. 7, 2001, now Pat. No. 6,597,415, which is a division of application No. 09/532,810, filed on Mar. 21, 2000, now Pat. No. 6,243,146, which is a continuation of application No. 08/979,572, filed on Nov. 26, 1997, now Pat. No. 6,057,896.

(30) Foreign Application Priority Data

| Nov. 26, 1996 | (KR) | 96-57610 |
| Aug. 14, 1997 | (KR) | 97-38854 |
| Sep. 27, 1997 | (KR) | 97-48775 |

(51) Int. Cl.$^7$ .............. G02F 1/136; G02F 1/1333; G02F 1/1339; H01L 29/04
(52) U.S. Cl. ............ 349/44; 349/43; 349/110; 349/138; 349/155; 257/59
(58) Field of Search .......... 349/38, 39, 42–44, 349/122, 138, 110, 153, 155; 257/59, 72, 595, 762

(56) References Cited

U.S. PATENT DOCUMENTS

| 4,905,006 A | 2/1990 | Pelgrom | 357/23.15 |
| 4,943,838 A | 7/1990 | Ukai | 357/23.7 |

(List continued on next page.)

FOREIGN PATENT DOCUMENTS

| EP | 0466495 | 1/1992 | |
| EP | 0725301 A1 | 8/1996 | G02F/1/1335 |
| JP | 62-239126 | * 10/1987 | |

(List continued on next page.)

OTHER PUBLICATIONS

Derwent–ACC–No: 1994–112160, "Prepn. of liquid crystal display elements by forming orientation film on opposed substrates, forming column spacers by etching, inserting LC and sealing.", Toshiba KK.*

Primary Examiner—Tarifur R. Chowdhury
(74) Attorney, Agent, or Firm—McGuireWoods LLP

(57) ABSTRACT

A passivation layer is formed by coating a flowable insulating material on the substrate where a thin film transistor and a storage capacitor electrode, and a pixel electrode is formed on the passivation layer. A portion of the passivation layer is etched using the pixel electrode as a mask to make a groove on the thin film transistor, and then a black matrix is formed by filling an organic black photoresist in the groove. To increase the storage capacitance, a portion of the passivation layer is removed or to form a metal pattern on the storage capacitor electrode. A flowable insulating material is used as a gate insulating layer to planarize the substrate. In the case of the etch stopper type thin film transistor, a photo definable material is used as the etch stopper layer to reduce the parasitic capacitance between the gate electrode and the drain electrode.

11 Claims, 24 Drawing Sheets

U.S. PATENT DOCUMENTS

| | | | |
|---|---|---|---|
| 4,956,680 A | 9/1990 | Tanaka et al. | 357/4 |
| 5,327,001 A | 7/1994 | Wakai et al. | 257/350 |
| 5,621,556 A | 4/1997 | Fulks et al. | 349/42 |
| 5,643,817 A | 7/1997 | Kim et al. | 437/51 |
| 5,719,422 A | 2/1998 | Burr et al. | 257/345 |
| 5,781,253 A | 7/1998 | Koike et al. | 349/40 |
| 5,781,254 A | 7/1998 | Kim et al. | 349/44 |
| 5,818,549 A | 10/1998 | Maruyama et al. | 349/42 |
| 5,818,551 A | 10/1998 | Park | 349/43 |
| 5,828,434 A * | 10/1998 | Koden et al. | 349/148 |
| 5,847,781 A | 12/1998 | Ono et al. | 349/43 |
| 5,852,481 A | 12/1998 | Hwang | 349/43 |
| 5,854,663 A | 12/1998 | Oh et al. | 349/42 |
| 5,859,683 A | 1/1999 | Tagusa et al. | 349/44 |
| 5,866,919 A | 2/1999 | Kwon et al. | 349/42 |
| 5,877,832 A | 3/1999 | Shimada | 349/43 |
| 5,880,794 A | 3/1999 | Hwang | 349/43 |
| 5,903,326 A | 5/1999 | Suman et al. | 349/42 |
| 5,926,235 A * | 7/1999 | Han et al. | 349/43 |
| 5,933,208 A * | 8/1999 | Kim | 349/106 |
| 5,970,318 A | 10/1999 | Choi et al. | 438/99 |
| 5,981,970 A | 11/1999 | Dimitrakopoulos et al. | 257/40 |
| 6,001,539 A | 12/1999 | Lyu et al. | 430/317 |
| 6,008,065 A | 12/1999 | Lee et al. | 438/30 |
| 6,038,008 A | 3/2000 | Kim et al. | 349/138 |
| 6,081,315 A | 6/2000 | Matsuyama et al. | 349/143 |
| 6,091,464 A | 7/2000 | Song | 349/38 |
| 6,097,467 A * | 8/2000 | Fujimaki et al. | 349/155 |
| 6,100,954 A | 8/2000 | Kim et al. | 349/138 |
| 6,122,025 A | 9/2000 | Kim | 349/110 |
| 6,160,598 A | 12/2000 | Lyu | 349/111 |
| 6,188,452 B1 | 2/2001 | Kim et al. | 349/43 |
| 6,211,928 B1 * | 4/2001 | Oh et al. | 349/43 |
| 6,441,468 B1 * | 8/2002 | Yamazaki | 257/642 |
| 6,507,045 B2 * | 1/2003 | Gu et al. | 257/72 |

FOREIGN PATENT DOCUMENTS

| | | |
|---|---|---|
| JP | 63-177472 | 7/1988 |
| JP | 1103148 | 4/1989 |
| JP | 1124824 | 5/1989 |
| JP | 401259563 A | 10/1989 |
| JP | 401283937 A | 11/1989 |
| JP | 402002174 A | 1/1990 |
| JP | 3225323 | 10/1991 |
| JP | 4118627 | 4/1992 |
| JP | 04-128823 | 4/1992 |
| JP | 4163528 | 6/1992 |
| JP | 5074763 | 3/1993 |
| JP | 5119350 | 5/1993 |
| JP | 5232459 | 9/1993 |
| JP | 6011716 | 1/1994 |
| JP | 6018928 | 1/1994 |
| JP | 406084946 A | 3/1994 |
| JP | 6333919 | 12/1994 |
| JP | 8015719 | 1/1996 |
| JP | 8166598 | 6/1996 |
| JP | 8179357 | 7/1996 |
| JP | 9236825 | 9/1997 |
| JP | 409230384 A | 9/1997 |
| JP | 9279742 | 10/1997 |
| JP | 410041519 A | 2/1998 |

* cited by examiner

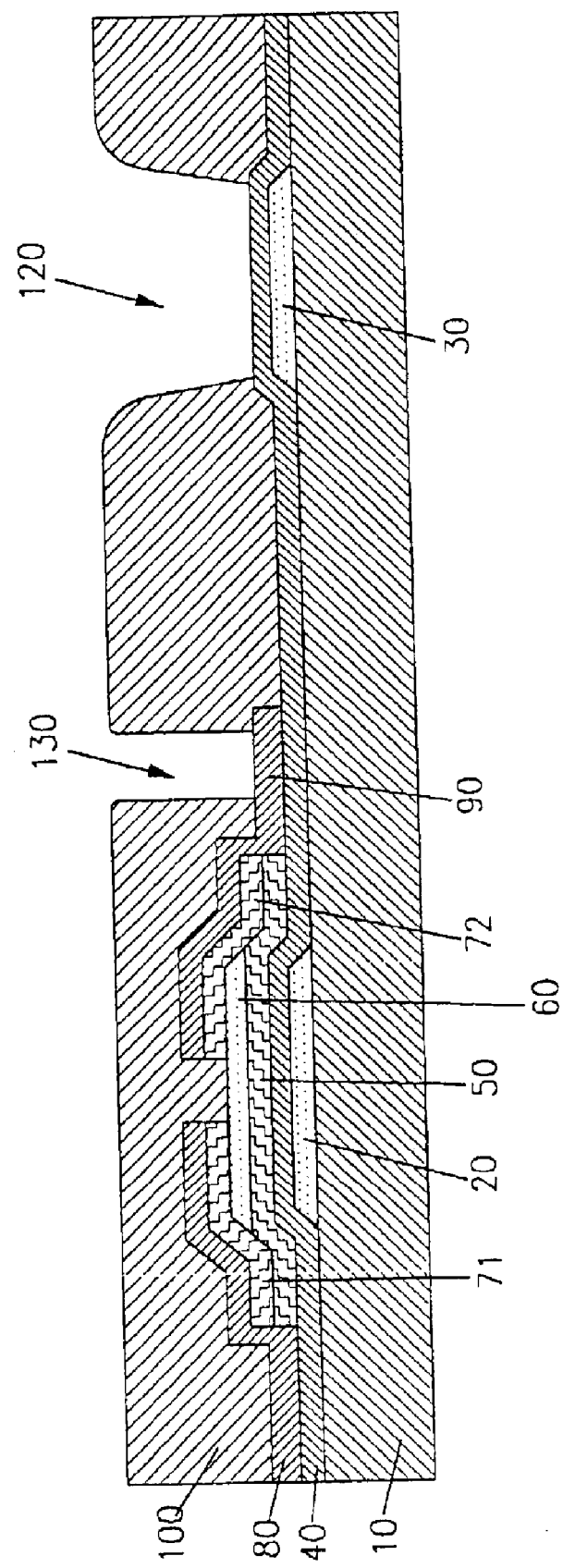

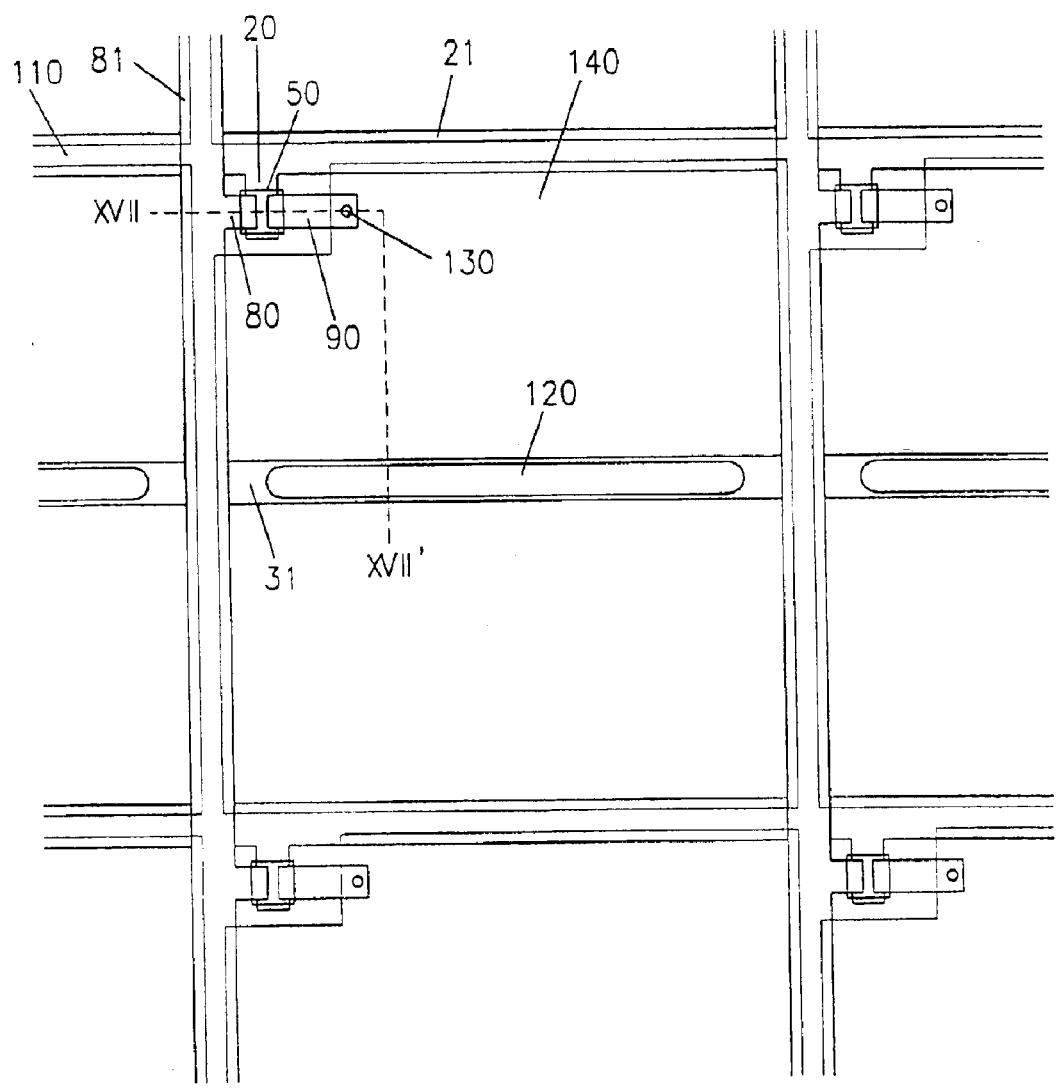

LIQUID CRYSTAL DISPLAYS USING ORGANIC INSULATING MATERIAL FOR A GATE INSULATING LAYER AND/OR HAVING PHOTOLITHOGRAPHIC FORMED SPACERS

RELATED APPLICATIONS

The present application is a continuation of and claims priority from U.S. application Ser. No. 09/800,700, now U.S. Pat. No. 6,597,415 filed Mar. 7, 2001, entitled THIN FILM TRANSISTOR SUBSTRATES FOR LIQUID CRYSTAL DISPLAYS INCLUDING A PASSIVATION LAYER HAVING A NON-UNIFORM THICKNESS, which is a divisional of and claims priority from U.S. application Ser. No. 09/532,810 (now U.S. Pat. No. 6,243,146), filed Mar. 21, 2000, entitled LIQUID CRYSTAL DISPLAYS USING ORGANIC INSULATING MATERIAL, which is a continuation of and claims priority from U.S. application Ser. No. 08/979,572 (now U.S. Pat. No. 6,057,896), filed Nov. 26, 1997, entitled LIQUID CRYSTAL DISPLAYS USING ORGANIC INSULATING MATERIAL FOR A PASSIVATION LAYER AND/OR A GATE INSULATING LAYER AND MANUFACTURING METHODS THEREOF, assigned to the assignee of the present invention, the disclosures of which are hereby incorporated herein by reference.

BACKGROUND OF THE INVENTION (a) Field of the Invention

The present invention relates to a thin film transistor liquid crystal display, more specifically to a thin film transistor liquid crystal display whose black matrix is formed on a thin film transistor substrate.

(b) Description of the Related Art

Most liquid crystal displays include a thin film transistor (TFT) substrate and a color filter substrate. Black matrix is generally formed on the color filter substrate and is used to shield the light leakage in the portions between pixels. However, misalignment between the TFT substrate and the color filter substrate may make it hard to shield the light leakage perfectly. For that reason, a method of forming the black matrix on TFTs, which is called black matrix on TFT (BM on TFT), was recently suggested.

FIG. 1 illustrates a cross-sectional view of a conventional BM on TFT type TFT substrate.

As shown in FIG. 1, a gate electrode 2 and a storage capacitor electrode 3 are formed on a transparent substrate 1. A gate insulating layer 4 is formed on the gate electrode 2 and the storage capacitor electrode 3. An amorphous silicon layer 5, an etch stopper layer 6 and an n+ amorphous silicon layer 7 are deposited sequentially on the gate insulating layer 4 over the gate electrode 2. A source electrode 8 and a drain electrode 9 are formed on the n+ amorphous silicon layer 7, and the source electrode 8 is connected to a data line (not shown). The gate electrode 2, the gate insulating layer 4, the amorphous silicon layer 5, the n+ amorphous silicon layer 7, the source electrode 8 and the drain electrode 9 form a TFT. A passivation layer 10 is formed on the TFT and the gate insulating layer 4, and a black matrix 11 is formed on the passivation layer 10 over the TFT. A pixel electrode 12 made of ITO (indium tin oxide) is formed on the passivation layer 10 in a pixel region, and connected to the drain electrode 9 through a contact hole in the passivation layer 10.

Because the pixel electrode 12 is close to the data line, coupling capacitance is generated between the pixel electrode 12 and the data line when the liquid crystal display is in operation, and the coupling capacitance distorts the display signal.

Since the black matrix 11 is formed on the TFT, the height difference between the portions near the TFT and the pixel electrode 12 can become larger to make defects of the alignment layer, thereby causing leakage. Although the light leakage may be reduced by increasing the width of the black matrix, in this case, the aperture ratio may decrease.

On the other hand, liquid crystal displays comprise two spaced parallel substrates and a liquid crystal layer therebetween. Spacers are inserted between the substrates to keep the cell gap, which is the thickness of the liquid crystal layer injected between two substrates, to be constant. It is common to use spherical spacers having uniform size, and the spacers are uniformly distributed on the pixel electrode 12. Because of the height difference in the color filter substrate and in the TFT substrate, it may be difficult to make a uniform cell gap. Therefore, the thickness of the liquid crystal layer becomes non-uniform, and display characteristics become worse. Moreover, the spacers on the pixel electrode 12 may cause a defect in the alignment layer and may cause the light from the backlight unit to be scattered, thereby causing the low transmittance of the liquid crystal cell and the light leakage.

SUMMARY OF THE INVENTION

It is therefore an object of the present invention to allow a reduction in the coupling capacitance generated between a data line and a pixel electrode.

It is another object of the present invention to allow a reduction in the defect of the alignment layer.

It is yet another object of the present invention to allow an increase in the aperture ratio of liquid crystal display.

It is still another object of the present invention to allow the cell gap of a liquid crystal display to be uniform.

It is another object of the present invention to allow an increase in the transmittance and a decrease in the light leakage by reducing the scattering of the back light.

These and other objects, features and advantages are provided, according to the present invention, by a liquid crystal display having a passivation layer made of a flowable insulating material. It is preferable that the flowable insulating material is an organic insulating material and has dielectric constant of 2.4–3.7. The passivation layer having a flat surface is formed on gate lines, data lines and TFTs in a TFT substrate to prevent the interference between signals of a pixel electrode formed on the passivation layer and of a data line formed under the passivation layer.

A portion of the passivation layer on gate lines, data lines and TFTs is removed to make a groove, and a black matrix made of an organic black photoresist is filled in the groove.

The thickness of the passivation layer is preferably 2.0–4.0 μm to have sufficient insulating characteristics, and the thickness of the black matrix is preferably 0.5–1.7 μm.

In the pixel region, storage capacitor electrode is formed on a transparent substrate to form a storage capacitor with the pixel electrode on the passivation layer. To increase the storage capacitance, the portion of the passivation layer on the storage capacitor electrode is thinned or removed.

Another way to compensate the storage capacitance is, for example, to thin a portion of a gate insulating layer between the storage capacitor electrode and the pixel electrode. In another embodiment, a contact hole exposing the storage capacitor electrode is formed in the gate insulating layer, and a metal pattern is formed on the gate insulating layer and connected to the storage capacitor electrode through the contact hole. Another embodiment provides a metal pattern connected to the pixel electrode that may be formed on a portion of the gate insulating layer on the storage capacitor electrode.

A flowable insulating layer is also used as a gate insulating layer such that the gate insulating layer may have a flat surface, and thus the parasitic capacitance between a gate electrode and a drain electrode can be reduced. A silicon nitride layer may be formed between the flowable gate insulating layer and a semiconductor layer made of amorphous silicon to prevent the interfacial characteristics of the amorphous silicon layer from being deteriorated. It is preferable that an organic insulating material is used and the thickness of the organic gate insulating layer is preferably 2,500–5,500 Å. It is preferable that the thickness of the silicon nitride layer is 500–800 Å.

In the case of an etch stopper type TFT substrate, a photo definable material is used as an etch stopper layer to decrease the parasitic capacitance between a gate-electrode and a drain electrode and to make process simple. It is preferable that an organic material is used and the thickness of the etch stopper layer is 3,000–5,000 Å.

To keep a cell gap between a TFT substrate and a color filter substrate, spacers made of a photo definable organic material are formed on the color filter substrate. The spacers are formed between color filters, and they are formed at the position corresponding to TFTs on the TFT substrate.

To make a TFT substrate according to the present invention, a flowable insulating layer which is to form a gate insulating layer is coated on a substrate having a gate electrode. A silicon nitride layer is deposited on the flowable insulating layer. A semiconductor layer in formed on the silicon nitride layer and the silicon nitride layer is etched away except the portion under the semiconductor layer.

When an etch stopper layer is made of a photo definable material, a photo definable organic layer is coated on the semiconductor layer and patterned to form an etch stopper layer. The process of patterning the etch stopper layer includes the steps of exposing the organic layer to light from the rear side of the substrate, exposing the organic layer to light from the front side of the substrate using an etch stopper mask, developing the organic layer and annealing the organic layer.

Next, an ohmic contact layer, a data pattern are formed sequentially. A flowable insulating material, which is used for a passivation layer, is coated, and a portion of the passivation layer on the storage capacitor electrode is removed.

Then, an ITO (indium tin oxide) layer is deposited and patterned to make a pixel electrode in a pixel region, the passivation layer is etched to a depth using the pixel electrode as a mask, and an organic black photoresist is filled in the etched region flatly to form a black matrix.

BRIEF DESCRIPTION OF THE DRAWINGS

FIGS. 15A, 16A and 17A show layouts of intermediate structures illustrating a method of manufacturing the TFT substrate according to the first embodiment of the present invention.

FIGS. 15B, 16B and 17B illustrate cross-sectional views of the TFT substrate along with the line XV–XV' of FIG. 15A, the line XVI–XVI' of FIG. 16A and the line XVII–XVII' of FIG. 17A.

DETAILED DESCRIPTION OF THE PREFERRED EMBODIMENTS

Figure 1:
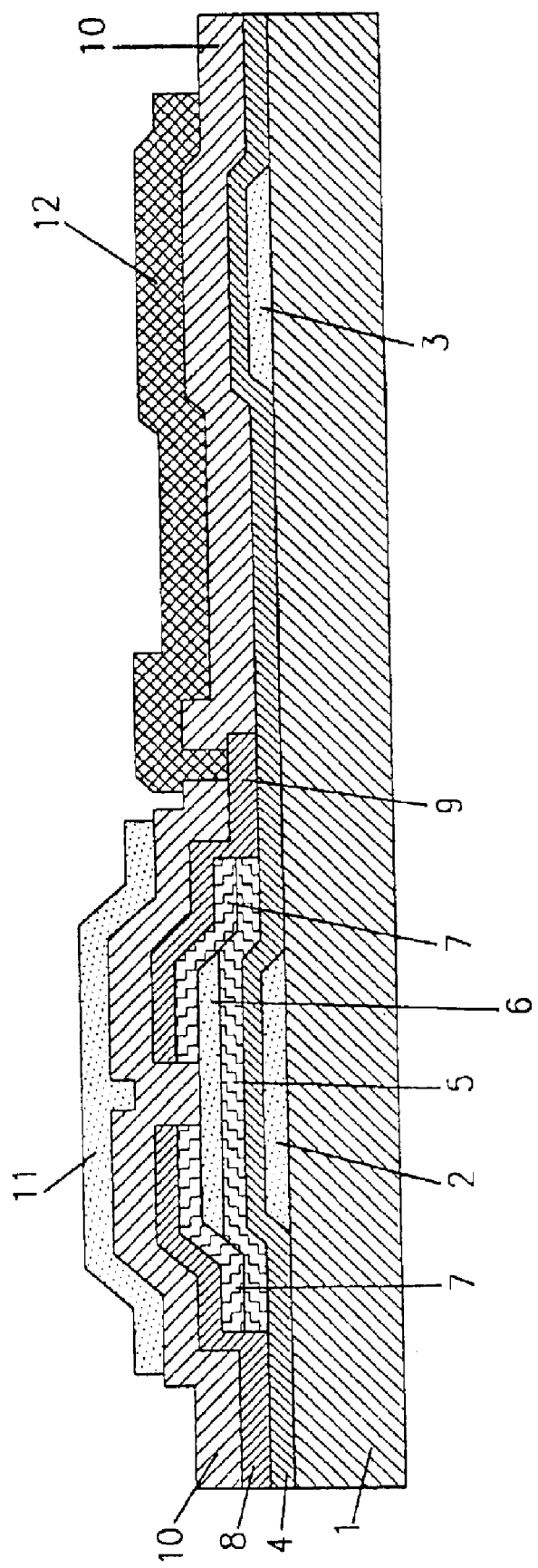
FIG. 1 is a cross-sectional view of a conventional BM on TFT substrate.

The present invention will now be described more fully hereinafter with reference to the accompanying drawings, in which preferred embodiments of the present invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity.

Liquid crystal displays according to the embodiment of the present invention comprise a liquid crystal cell comprising a TFT substrate and a color filter substrate, liquid crystal material injected into the cell, driving ICs and peripheral devices.

Figure 2:
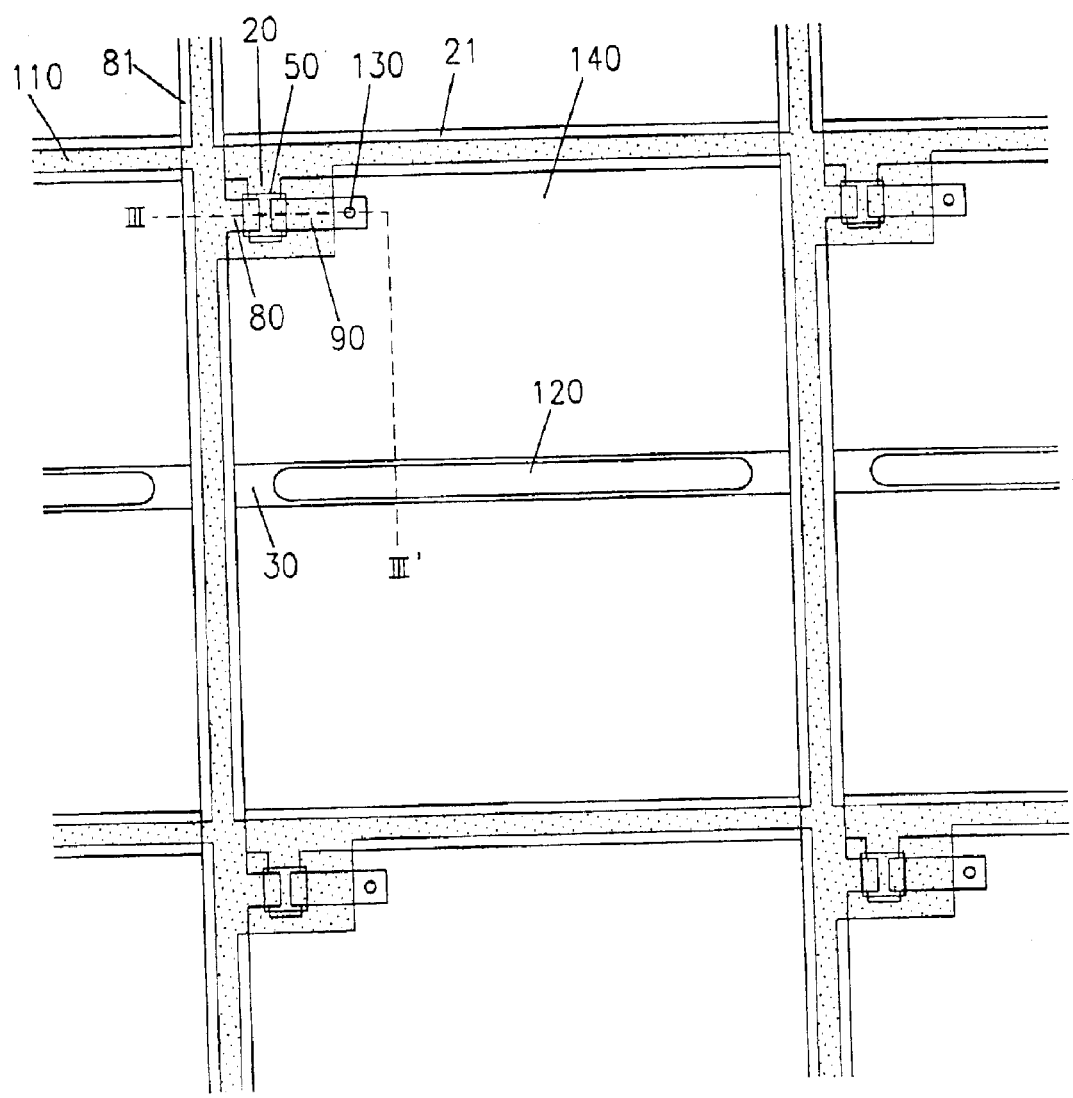
FIG. 2 shows a layout of a TFT substrate according to a first embodiment of the present invention.
Figure 3:
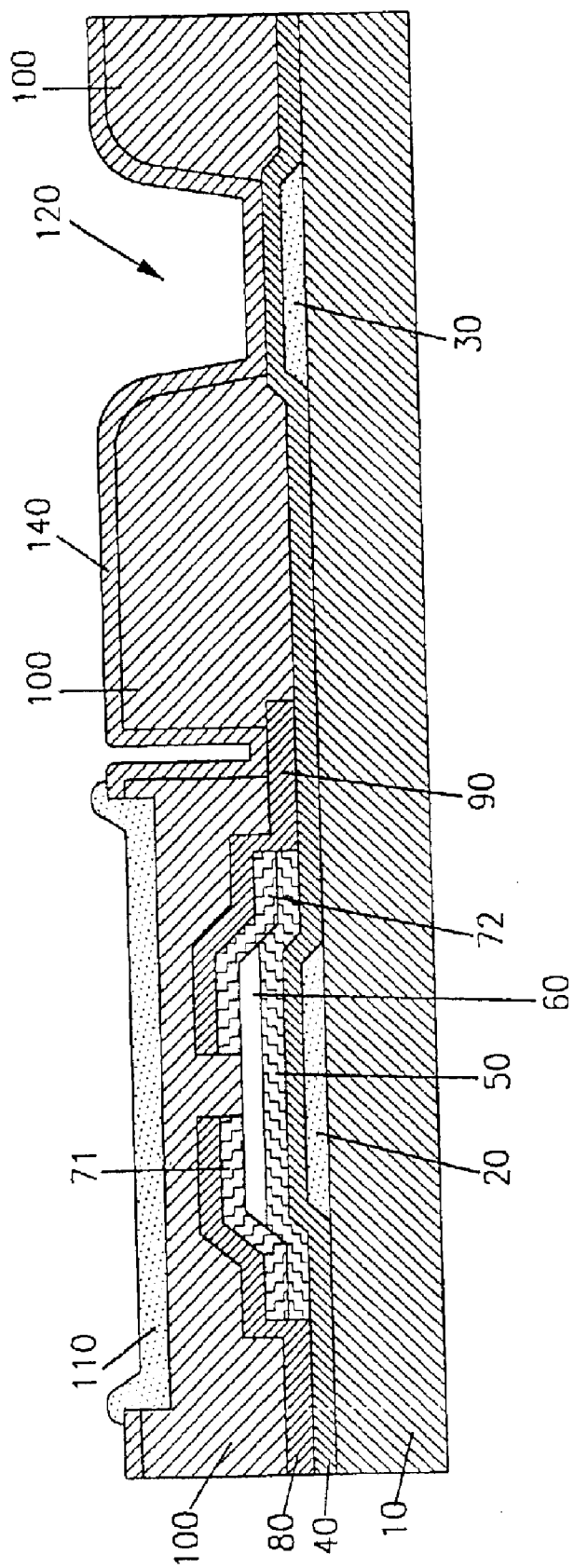
FIG. 3 illustrates a cross-sectional view of a TFT substrate shown in FIG. 2 along the line III–III'.

FIG. 2 shows a layout of a TFT substrate according to a first embodiment of the present invention, and FIG. 3 illustrates a cross-sectional view of a TFT substrate shown in FIG. 2 along the line III–III'.

As shown in FIGS. 2 and. 3, a gate line 21 which transmits scanning signals from the outside, a gate electrode 20 which is a branch of the gate line 21 and a storage capacitor electrode 30 which is parallel to the gate line 21 are formed on a transparent insulating substrate 10 such as glass. A gate insulating layer 40 is formed thereon.

A data line 81 which is perpendicular to the gate line 21 and transmits display signals from the outside is formed on the portion of gate insulating layer 40. An amorphous silicon (a-Si) layer 50 is formed on the gate insulating layer 40 on the gate electrode 20. An etch stopper layer 60 and an ohmic contact layer 71 and 72 made of heavily doped amorphous silicon with n type ions (n+ a-Si) are formed on the a-Si layer 50 in sequence. A source electrode 80 and a drain electrode 90 are formed on the ohmic contact layer 71 and 72 respectively, and the source electrode 80 is connected to the data line 81.

Here, the gate electrode 20, the source electrode 80, the drain electrode 90, the gate insulating layer 40, the ohmic contact layer 71 and 72 and the a-Si layer 50 form a TFT, and the channel of the TFT is generated in the portion of the a-Si layer 50 between the source electrode 80 and the drain electrode 90. When the scanning signal is applied to the gate electrode 20 through the gate line 21, the TFT is turned on and the display signal which reaches the source electrode 80 through the data line 81 flows into the drain electrode 90 through the channel in the a-Si layer 50.

A passivation layer 100 having a flat surface is formed on the TFT and the gate insulating layer 40. The passivation layer 100 is made of a flowable organic insulating material having low dielectric constant of 2.4–3.7 and the thickness of 2.0–4.0 $\mu$m.

Compared with the silicon nitride layer which is generally used as a passivation layer, an organic insulating layer which is thicker by 10 times than the silicon nitride layer has almost the same transmittance. For example, the organic insulating layer of 2.51 $\mu$m has the same transmittance as the silicon nitride layer of 0.2 $\mu$m with respect to the visible light.

Examples of flowable insulating materials are photo-BCB, BCB and PFCB produced by Dow Chemical Co., acrylic photoresist produced by JSR Co., and polyimide, and SOG (spin on glass) is also available. Since those materials are flowable, the passivation layer may have a flat surface by using spin coating method.

The passivation layer 100 has a contact hole 130 exposing the drain electrode 90, and the portion of the passivation layer 100 on the storage capacitor electrode 30 is thinned to form a trench or is removed to expose the gate insulating layer 40. In a pixel region defined by the gate line 21 and the data line 81, a pixel electrode 140 made of ITO (indium tin oxide) is formed on the passivation layer 100. The pixel electrode 140 is connected to the drain electrode 90 through the contact hole 130, and receives the display signal from the drain electrode 90 to drive liquid crystal molecules.

A portion of the passivation layer 100, which is not covered with the pixel electrode 140, is located on the TFT, the gate line 21 and the data line 81, and is etched by a depth to make a groove. A black matrix 110 made of an organic black photoresist is filled in the groove and has a flat surface. The thickness of the black matrix 110 is 0.5–1.7 $\mu$m and the optical density of the black matrix 110 is equal to or more than 2.5 to have a sufficient light shielding characteristics. The thickness of the black matrix 110 may vary with the available material, and especially the thickness depends on the optical density of the material. If the material having high optical density is used, the thickness of the black matrix can be decreased. Since the pixel electrode 140 is in contact with the passivation layer 100, it is preferable that the black matrix 110 has the high resistance, for instance, its surface resistance is preferably equal to or more than $10^{10}$ $\Omega/\square$.

Carbon base organic materials or pigment type organic materials may be used as the black matrix 110, and since the carbon base organic materials have higher optical density than the pigment type materials, the carbon base organic materials are preferable. However, graphite type organic materials having high optical density may not be as good for the black matrix because of its low surface resistance.

The storage capacitor electrode 30 and the pixel electrode 140 form a storage capacitor. Because there is thick passivation layer 100 between the two electrodes 30 and 140, the storage capacitance may not be sufficiently large. To compensate for the storage capacitance, the portion of the passivation layer between the two electrodes 30 and 140 may be removed or become thinned.

Figure 4:
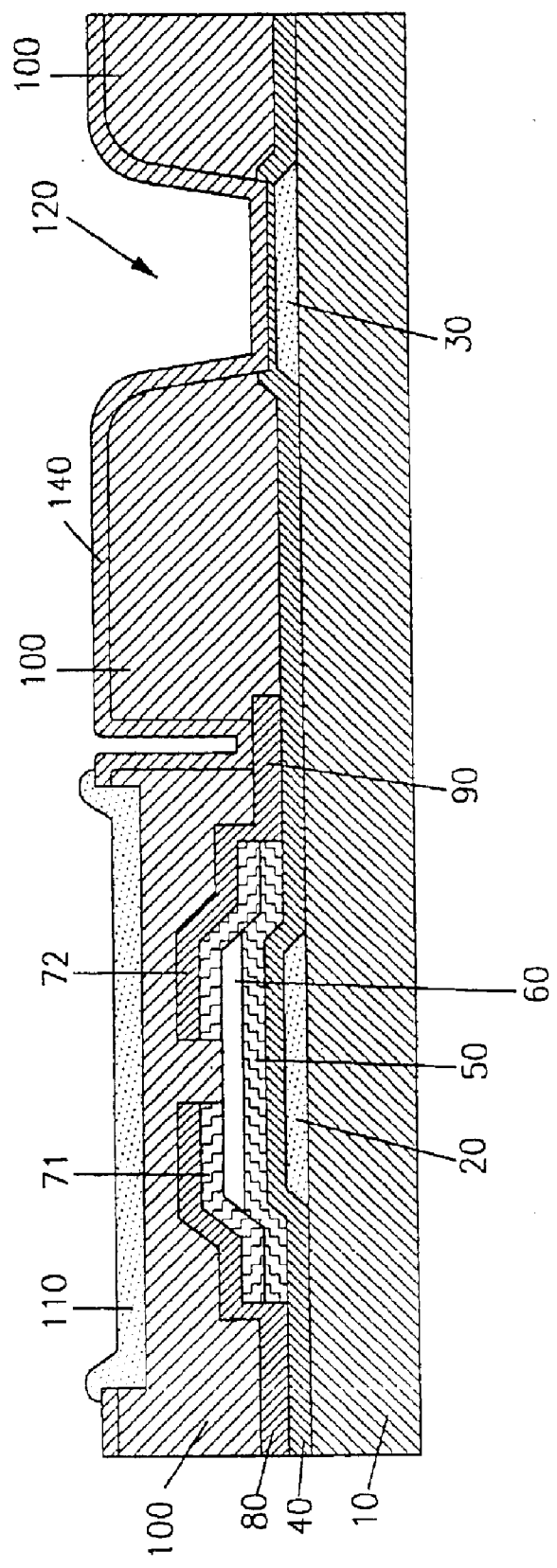
FIGS. 4–11 are cross-sectional views of TFT substrates according to second to ninth embodiments respectively.
Figure 5:
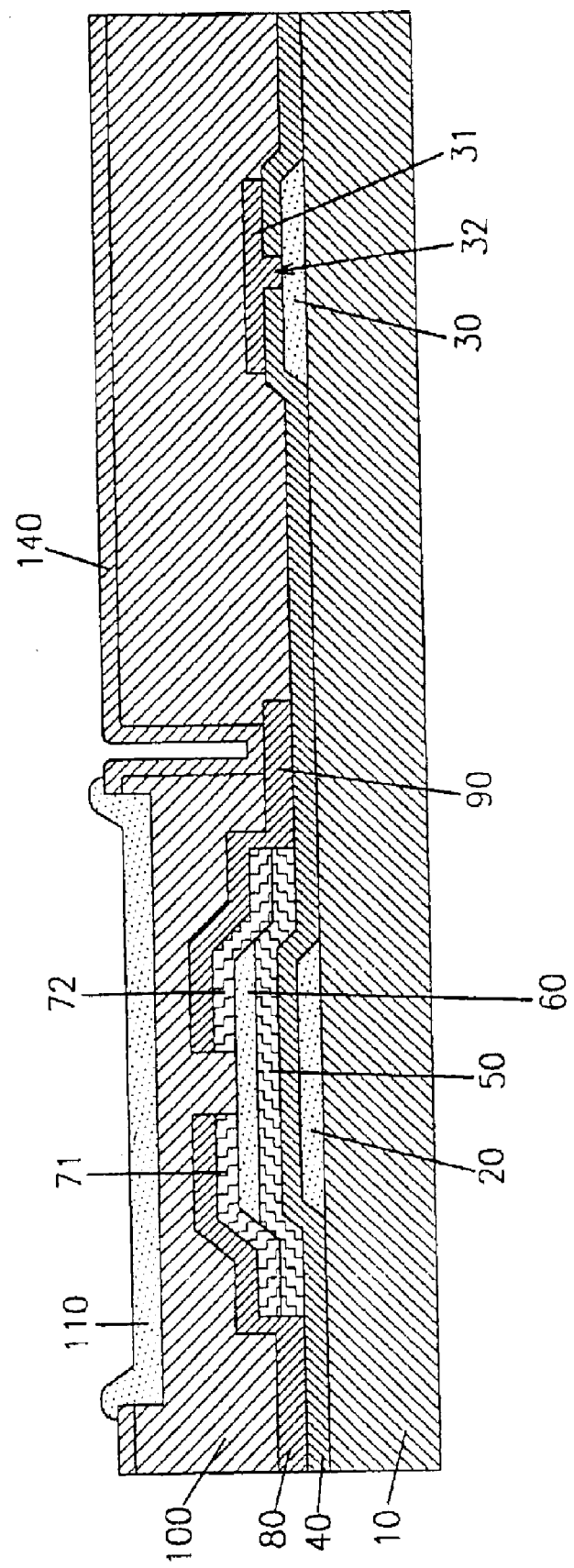
Figure 6:
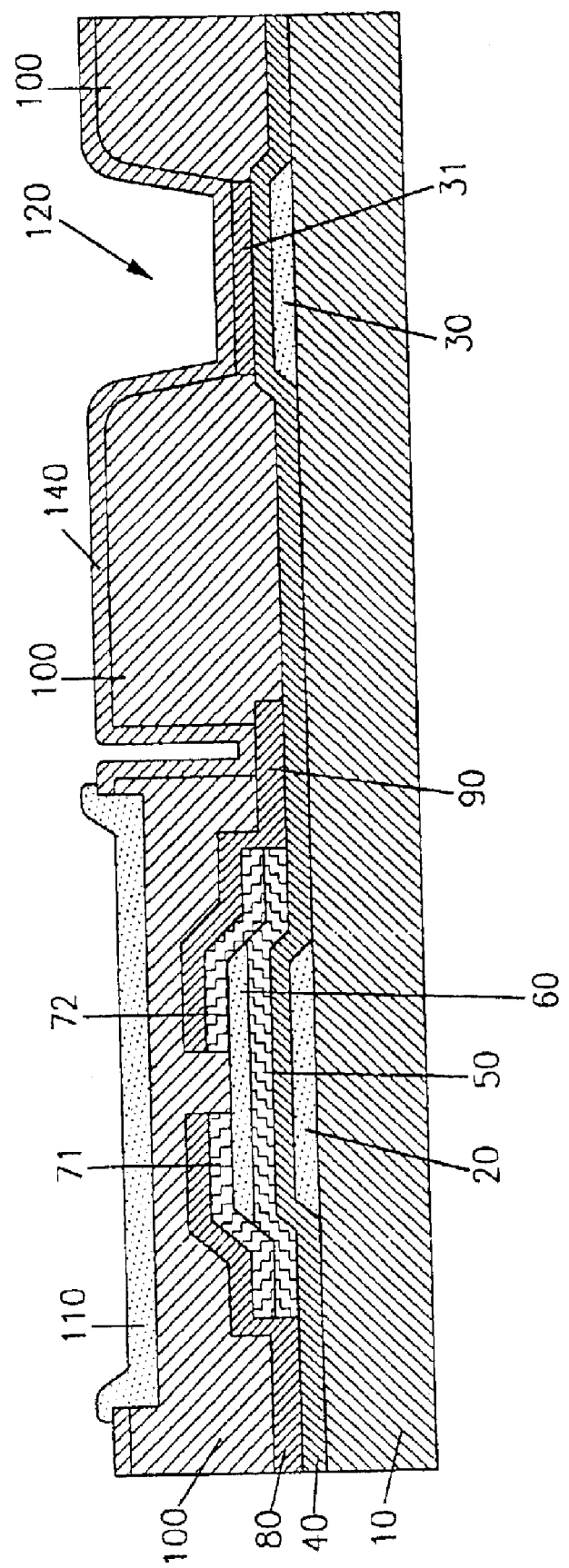

The TFT substrate may have some other modified structures to compensate the storage capacitance. FIGS. 4–6 illustrate cross-sectional views of TFT substrates according to second to fourth embodiments of the present invention which are improved to compensate storage capacitance.

According to the second embodiment of the present invention, as shown in FIG. 4, the portion of the passivation layer 100 on the storage capacitor electrode 30 is removed, and the portion of the gate insulating layer 40 on the storage capacitor electrode 30 is thinner than the other portions. To keep the uniform thickness of the portion of the gate insulating layer 40 on the storage capacitor electrode 30, the gate insulating layer 40 may include two layers which have different etch rates, and the portion of the upper layer on the storage capacitor electrode 30 may be removed.

According to the third embodiment of the present invention, as illustrated in FIG. 5, a metal pattern 31 is formed on the portion of the gate insulating layer 40 on the storage capacitor electrode 30. The metal pattern 31 is connected to the storage capacitor electrode 30 through a contact hole 32 in the gate insulating layer 40, and covered with the passivation layer 100.

According to the fourth embodiment of the present invention, as illustrated in FIG. 6, a metal pattern 31 is formed on the portion of the gate insulating layer 40 on the storage capacitor electrode 30. The portion of the passivation layer 100 on the metal pattern 31 is removed to form a contact hole 120, and the pixel electrode 140 covers the metal pattern 31 through the contact hole 120.

As described above, since the organic passivation layer 100 having low dielectric constant is formed between the pixel electrode 140 and the data line 81, the coupling capacitance between the pixel electrode 140 and the data line 81 may be reduced, and thereby it is possible to make the pixel electrode 140 to overlap the data line 81 and the gate line 21. Accordingly, by decreasing the area which the black matrix occupies and increasing the area which the pixel electrode occupies, the aperture ratio of the TFT substrate can be enlarged.

In addition, since the black matrix 110 is formed on the TFT substrate, the photo induced leakage current due to the reflection of the back light by the black matrix may be reduced. Moreover, because the surface of the TFT substrate is planarized, the problem of a defect in the alignment layer, which is caused by the height difference of the pattern, may be prevented or reduced.

Figure 7:
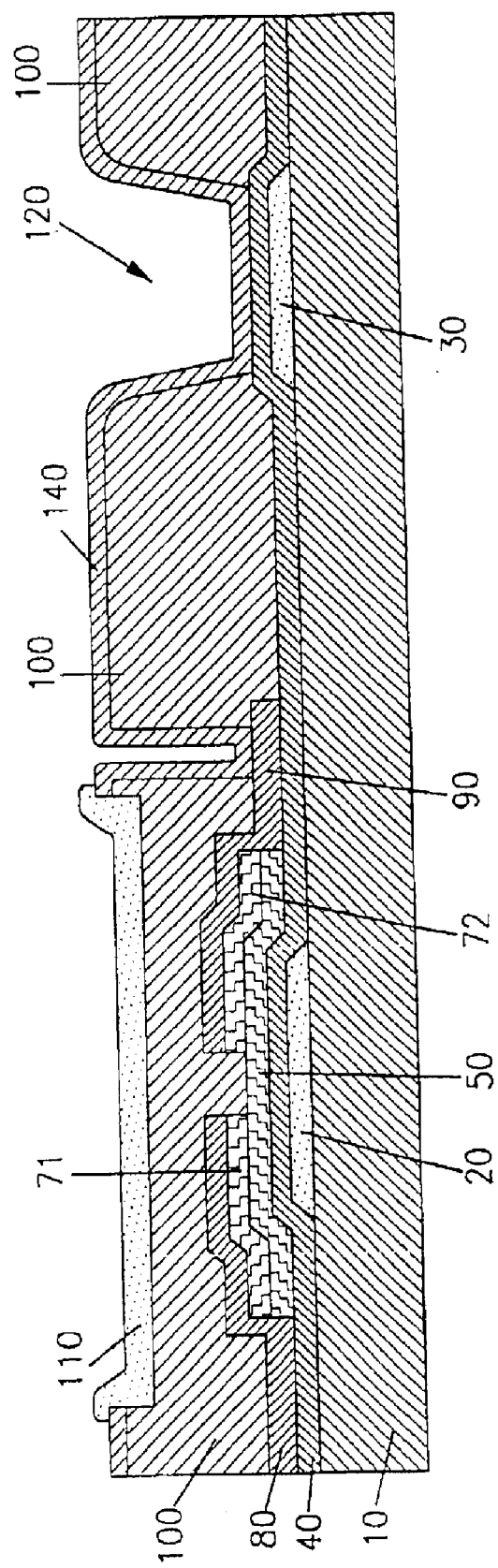

FIG. 7 illustrates a cross-sectional view of an etch back type TFT substrate according to the fifth embodiment of the present invention, and the layout view of the TFT is substantially the same as FIG. 2. The structure of the TFT substrate according to this embodiment is substantially the same as that according to the first embodiment shown in FIG. 3. However, the TFT of this embodiment does not have an etch stopper layer.

Therefore, a channel region of the a-Si layer 50 of the TFT is directly in contact with the organic insulating layer. However, the characteristics of the TFT need not be affected.

The TFT substrate may have some other modified structures to compensate the storage capacitance similar to the second to fourth embodiments of the present invention except for the structures of the TFTs.

Figure 8:
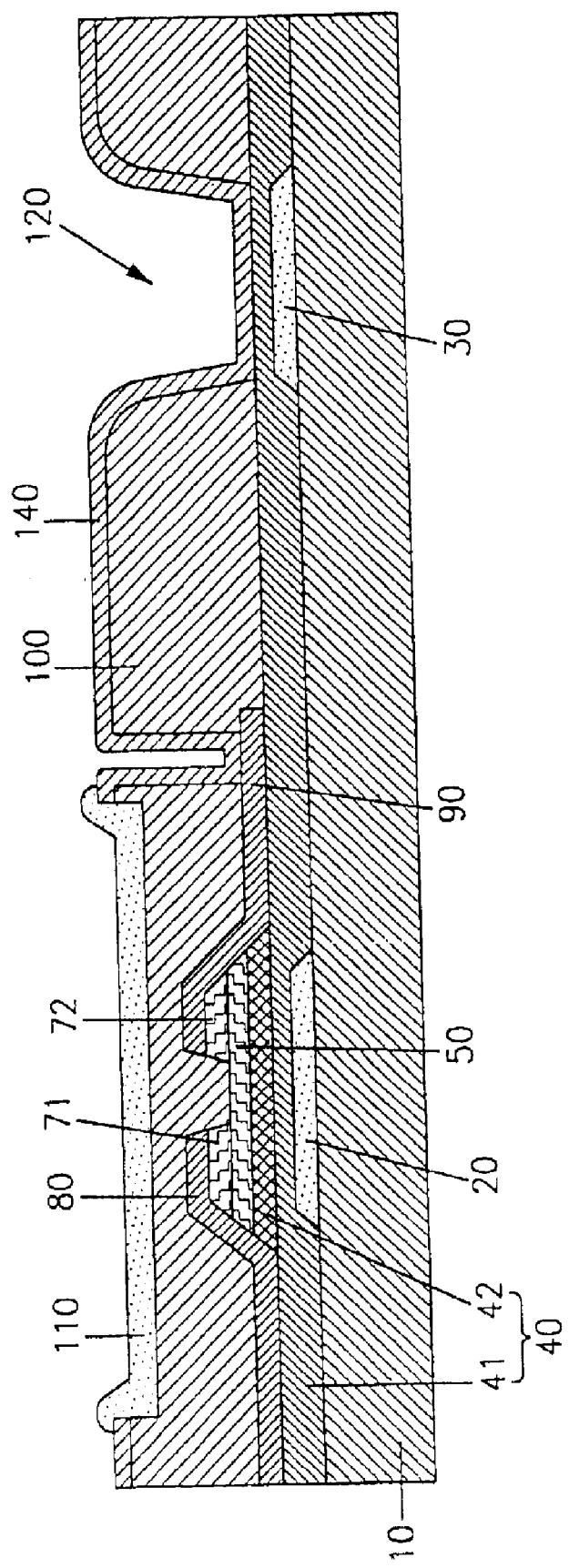

A flowable insulating layer is also used as a gate insulating layer such that the gate insulating layer has the flat surface. According to the sixth embodiment of the present invention, a gate insulating layer is double-layered structure including a flowable insulating layer and a silicon nitride layer. FIG. 8 shows a cross-sectional view of a TFT substrate according to the sixth embodiment of the present invention, and the layout view of the TFT is substantially the same as FIG. 2.

A flowable organic insulating layer 41 having the thickness of 2,500–5,500 Å is formed on a substrate having a gate electrode and a storage capacitor electrode. A silicon nitride layer 42 having the thickness of 500–800 Å is formed between the flowable organic insulating layer 41 and an amorphous silicon layer 50.

When only a flowable organic insulating material is used as a gate insulating layer, the gate insulating layer has a flat surface. However, the characteristics of the amorphous silicon layer formed thereon may be deteriorated. Therefore, the silicon nitride layer 42 is inserted between the flowable organic insulating layer 41 and the a-Si layer 50, and thus, it is possible to make the thickness of a-Si layer less than 1,000 Å to reduce photo induced leakage current. However, the silicon nitride layer 42 also may not be used.

As shown in FIG. 8, the silicon nitride (SiNx) layer 41 is formed only under the a-Si layer 50. If the SiNx layer is formed all over the flowable organic insulating layer, the triple layer of the flowable organic insulating layer, the SiNx layer and the passivation layer is formed at the gate pad region. Because the etch rate of the organic insulating layer and that of the SiNx are different, it may not be easy to form contact holes in the gate pad region. Therefore, the SiNx layer except the portion under the a-Si layer is removed in advance to make it easier to form the contact holes.

The structure which is not described above is similar to the TFT substrate according to the fifth embodiment of the present invention.

The TFT substrate may have some other modified structures to compensate the storage capacitance similar to the second to fourth embodiments of the present invention except for the structures of the TFTs.

Figure 9:
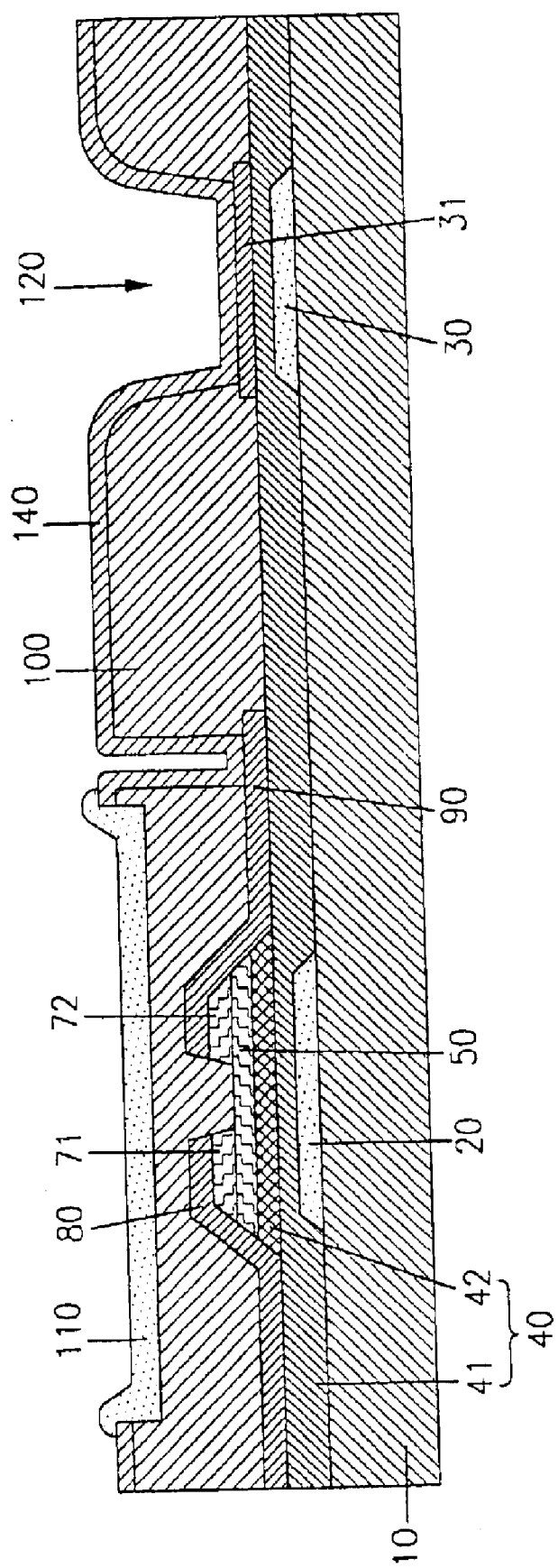

The seventh embodiment of the present invention shown in FIG. 9 suggests a TFT substrate having a metal layer 31 formed on the portion of the organic insulating layer 41 on the storage capacitor electrode 30 as in the fourth embodiment of the present invention. The remaining structure is similar to that of the TFT shown in FIG. 8.

According to the eighth embodiment of the present invention, an etch stopper layer is made of an organic material.

FIG. 8 illustrates a cross-sectional view of an etch stopper type TFT substrate according to the eighth embodiment of the present invention. According to the eighth embodiment of the present invention, a gate insulating layer includes an organic insulating layer and an SiNx layer as in the sixth embodiment of the present invention.

An etch stopper layer 61 made of a photo definable organic material is formed between an a-Si layer 50 and an ohmic contact layer 71 and 72. The remaining structure is similar to that of the TFT substrate shown in FIG. 9. The parasitic capacitance between a gate electrode and a drain electrode causing kickback decreases since the dielectric constant of the organic material is relatively low. In addition, the manufacturing process is relatively simple since the a-Si layer 50 and the SiNx layer 42 is etched using the etch stopper layer 61 as a mask.

The structure which is not described above is similar to the TFT substrate according to the sixth embodiment of the present invention.

The TFT substrate may have some other modified structures to compensate the storage capacitance similar to the second to the fourth embodiments of the present invention except for the structures of the TFTs.

Figure 10:
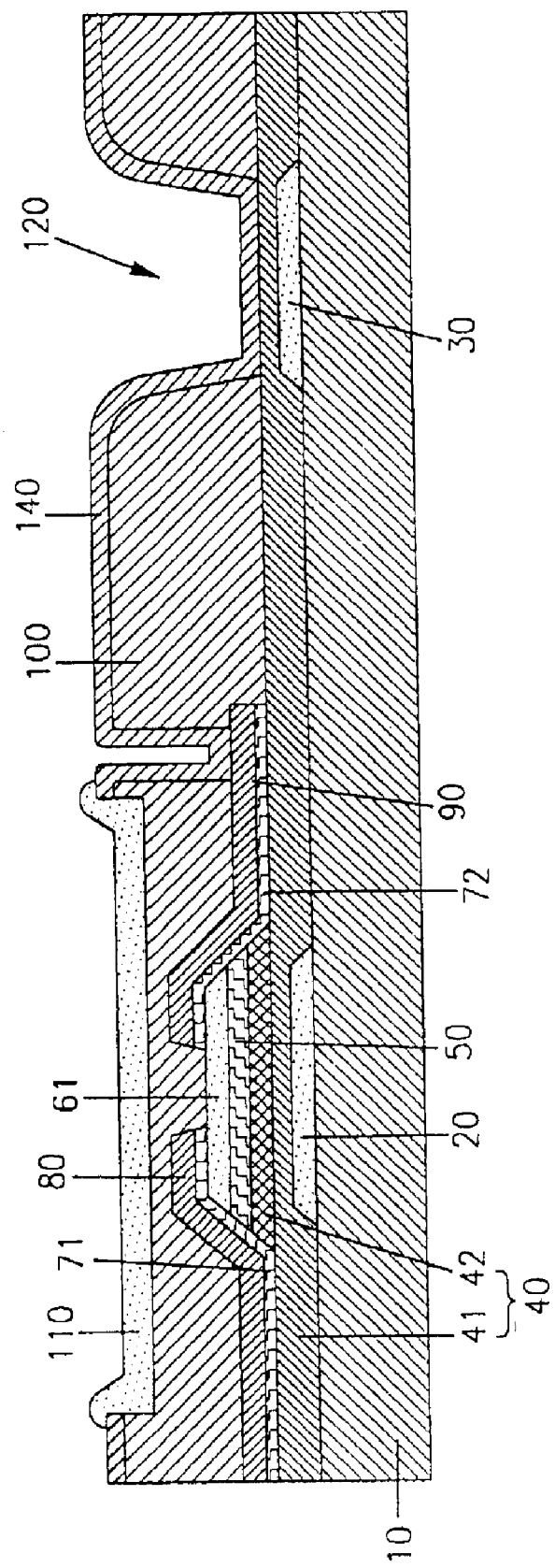
Figure 11:
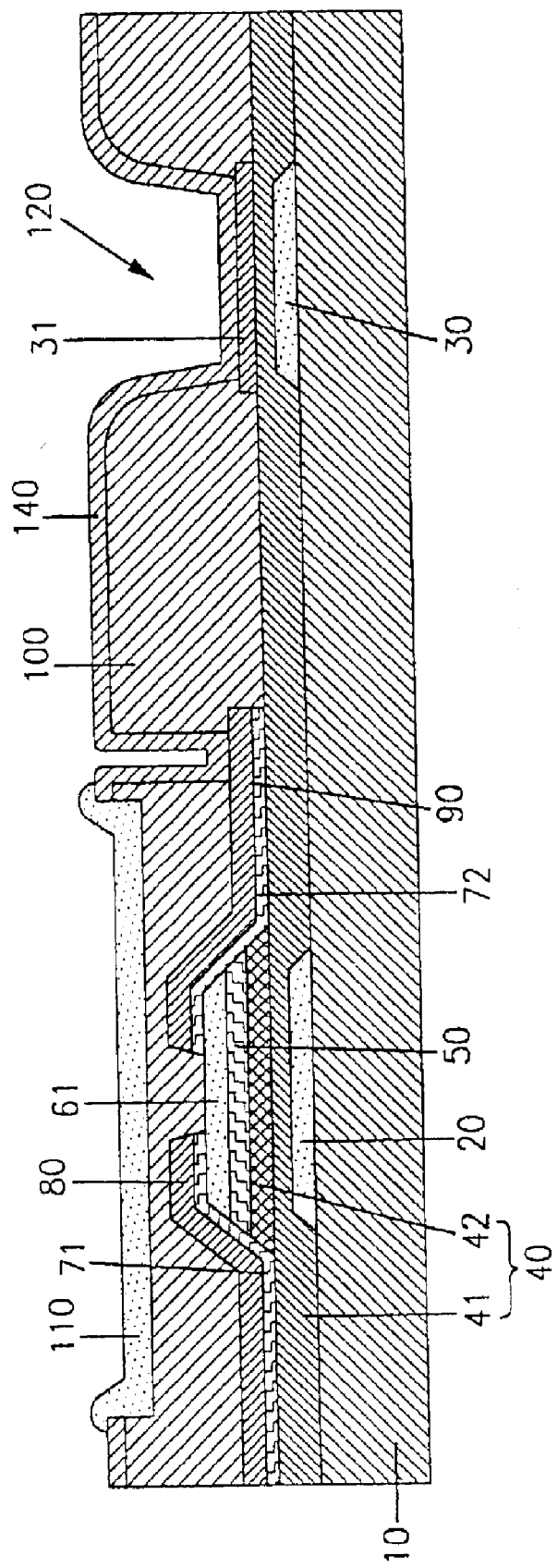

The ninth embodiment of the present invention shown in FIG. 11 suggests a TFT substrate having a metal layer 31 formed on the portion of the organic insulating layer 41 on the storage capacitor electrode 30 as in the fourth embodiment of the present invention. The remaining structure is similar to that of the TFT shown in FIG. 10.

Figure 12:
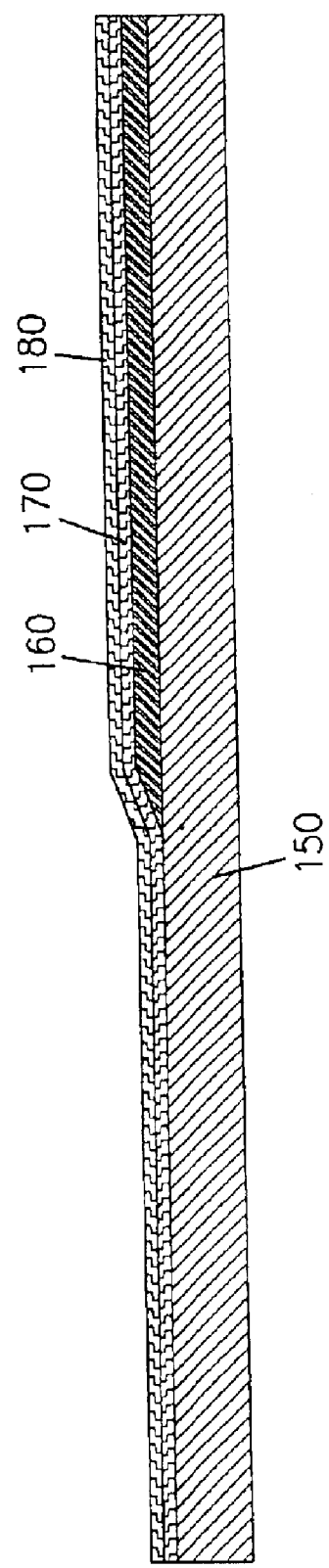
FIG. 12 illustrates a cross-sectional view of a color filter substrate according to an embodiment of the present invention.

FIG. 12 illustrates a cross-sectional view of a color filter substrate according to an embodiment of the present invention. As shown in FIG. 12, a color filter 160 is formed on a transparent insulating substrate 150, and a passivation layer 170 and a common electrode 180 is successively formed thereon.

Figure 13:
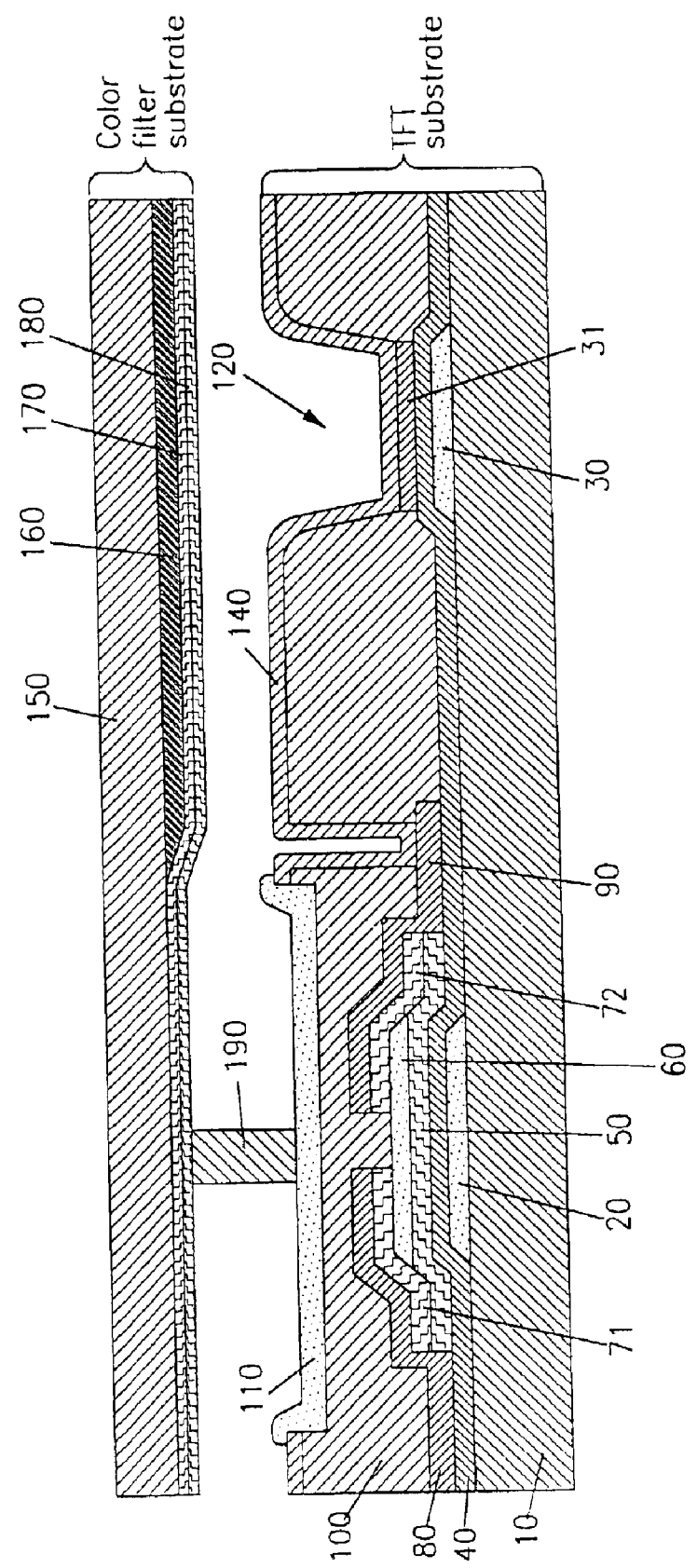
FIG. 13 illustrates a cross-sectional view of a liquid crystal display cell according to an embodiment of the present invention.

FIG. 13 illustrates a cross-sectional view of a liquid crystal display cell according to an embodiment of the present invention. The TFT substrate and the color filter substrate are arranged such that the color filter 160 corresponds to the pixel electrode 140. To keep up the cell gap between the TFT substrate and the color filter substrate, a column shaped spacer 190 is formed on the color filter substrate. The spacer 190 is made of a photo definable organic material, and positioned corresponding to the TFT on the TFT substrate. The spacer 190 does not affect the characteristics of the TFT since there are planarized layers 100 and 110 having a sufficient thickness on the channel of the TFT.

Figure 14A:
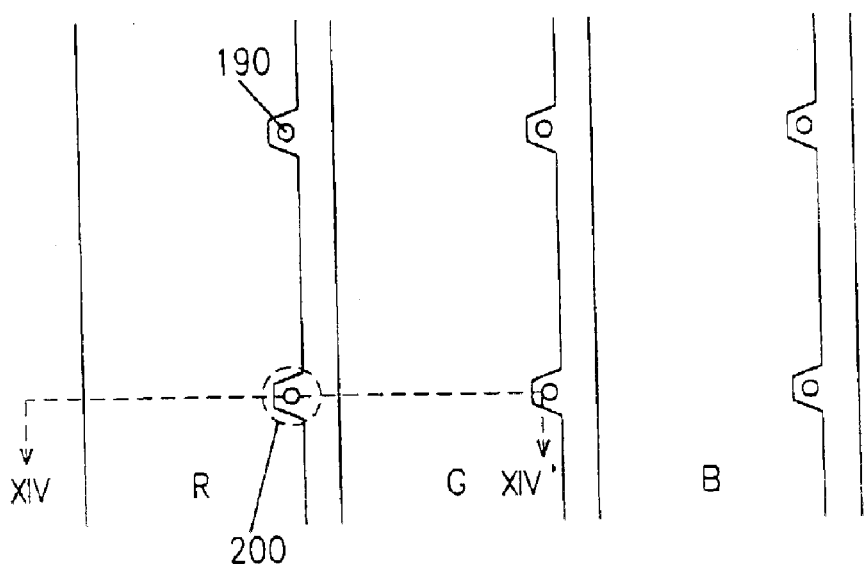
FIG. 14A illustrates a layout of a color filter substrate shown in FIG. 12 to show the position of spacers.
Figure 14B:
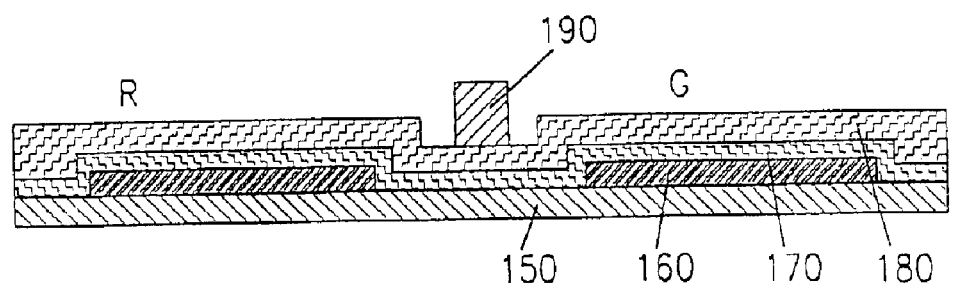
FIG. 14B is a cross-sectional view of the color filter substrate illustrated in FIG. 14A along the line XIV–XIV'.

FIG. 14A illustrates a layout of a color filter substrate to show the position of spacers, FIG. 14B is a cross-sectional view of the color filter substrate illustrated in FIG. 14A along the line XIV–XIV'. In FIGS. 14A and 14B, R, G and B indicate red, green and blue color filters respectively. The color filter 160 has a concave shape (a) as shown in FIG. 14A, the spacers 190 are formed there.

Since the spacer 190 is made of a photo definable organic material and made by photolithography process, the spacers 190 can be placed at the desired position and the spacers 190 can have a uniform thickness. For example, as shown in FIGS. 14A and 14B, the spacers 190 can be formed at the exact position corresponding to the TFTs on the TFT substrate which has a uniform height, and thereby uniform cell gap is obtained. In addition, since TFTs are covered with the black matrix and they need not affect the aperture ratio, the spacers 190 need not reduce the aperture ratio. Moreover, since the spacers 190 need not be placed on the color filters R, G and B, color filters may have different thickness in order to have different cell gaps for optimizing the color coordinate and the transmittance.

Since the spacers 190 have a height, the shading area due to the spacers 190 may be generated, which can cause problems in the rubbing process. However, since the width of the spacers 190 can be made sufficiently small, the shading area is narrower than the TFTs and shielded by the black matrix 110.

Referring to FIGS. 15A–17B, a method of manufacturing liquid crystal display according to an embodiment of the present invention will now be described.

Figure 15A:
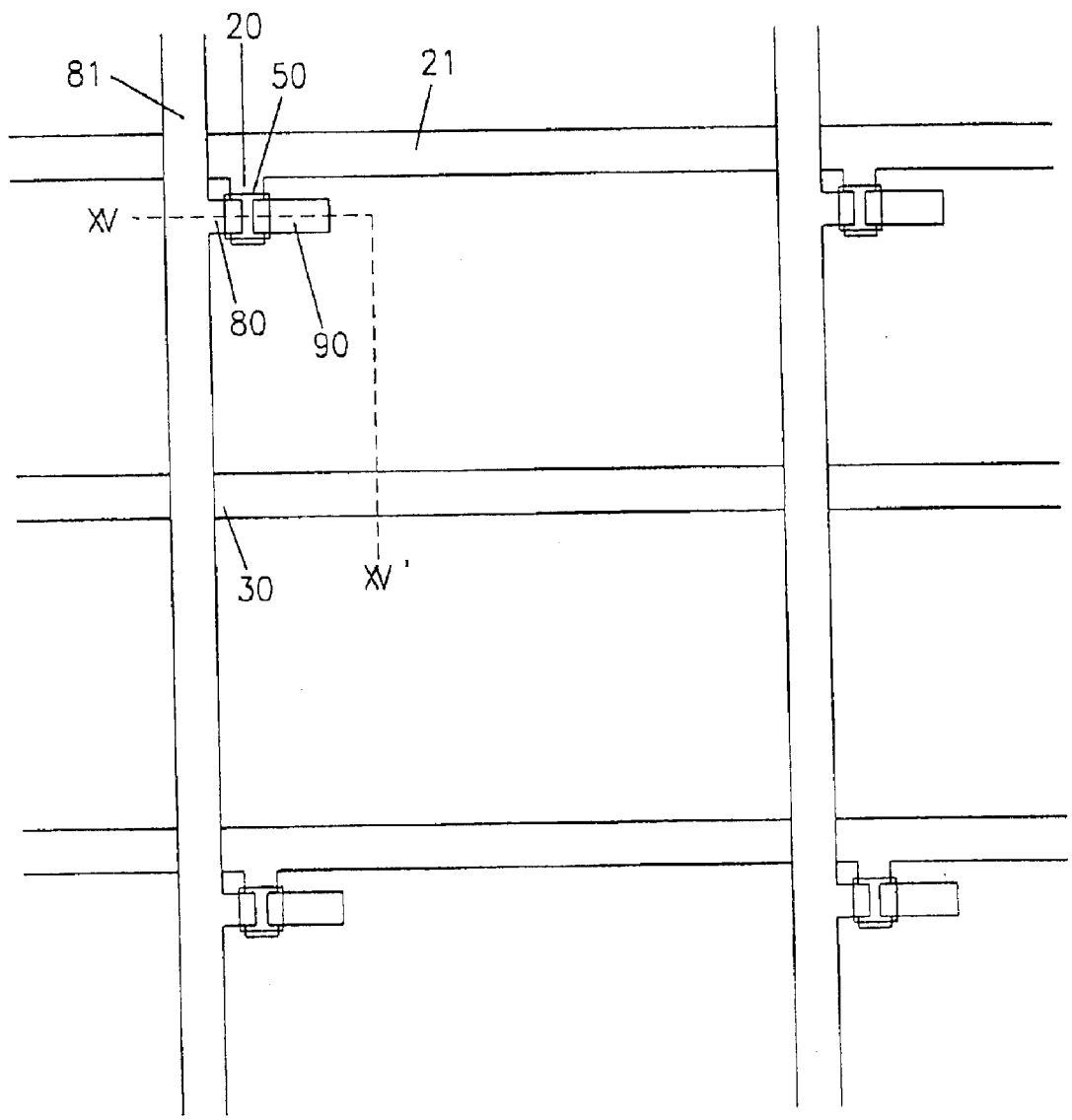
Figure 15B:
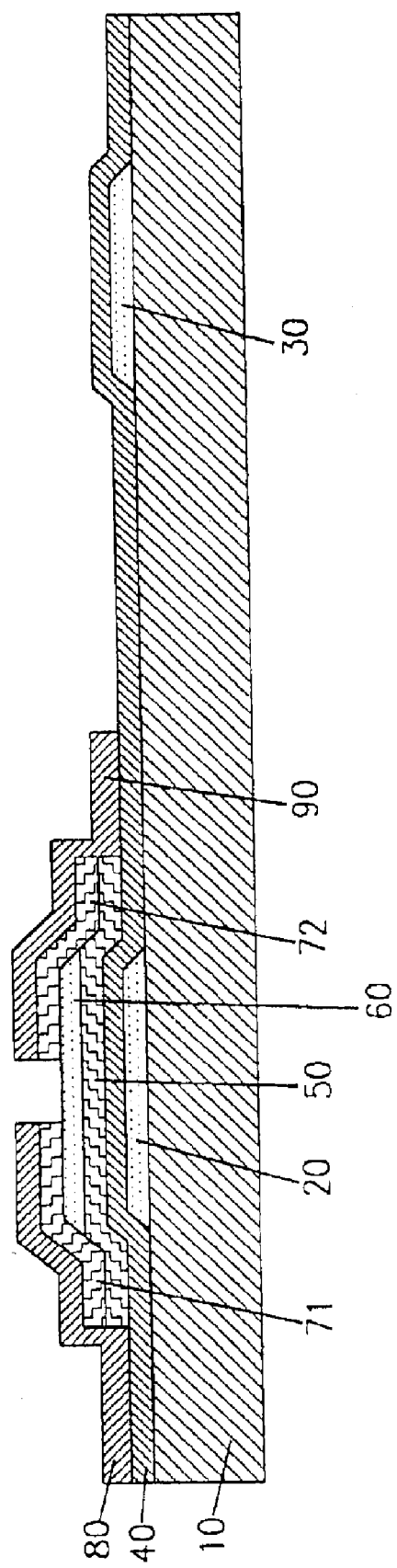
Figure 16A:
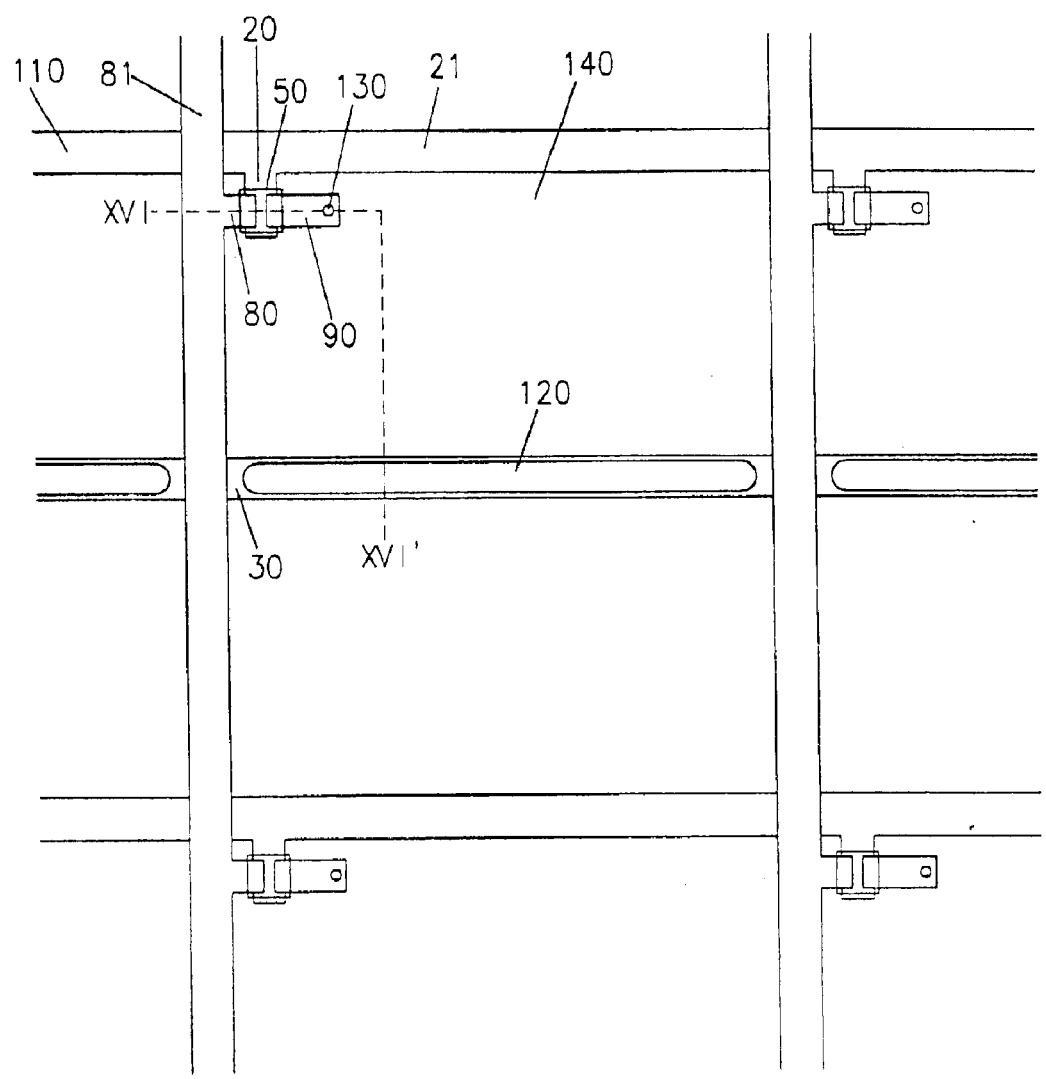
Figure 17B:
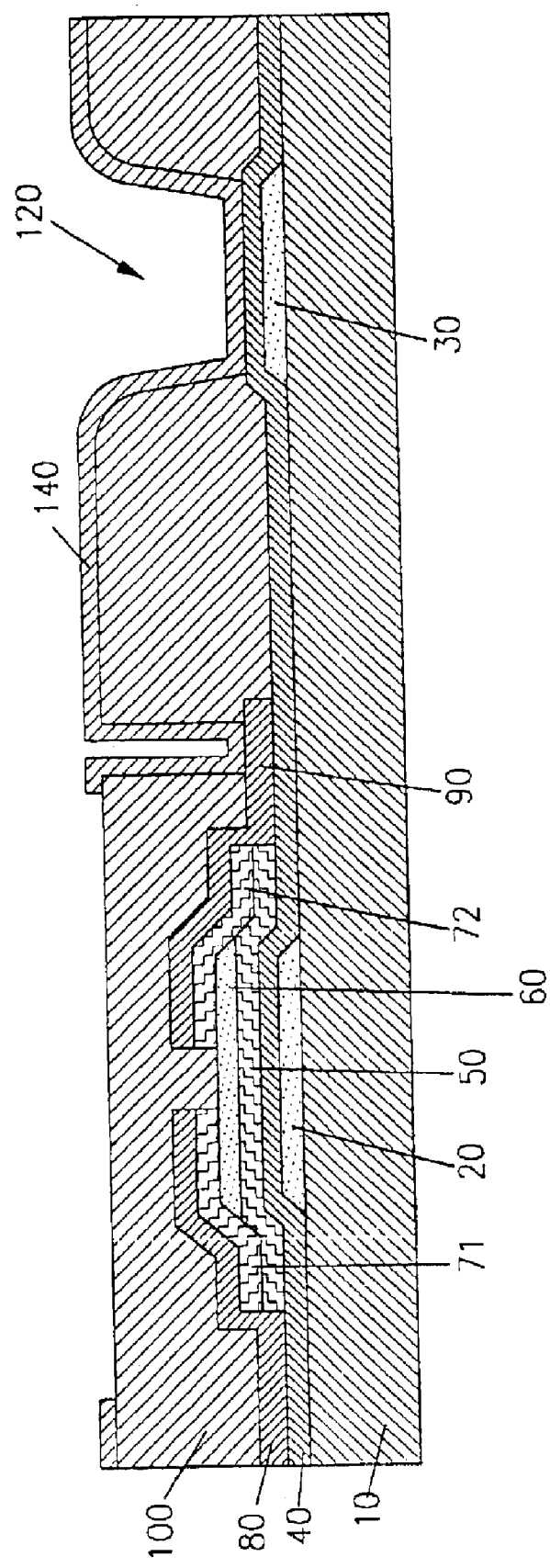

FIGS. 15A, 16A and 17A show layouts of intermediate structures illustrating a method of manufacturing the TFT substrate of the first embodiment shown in FIGS. 2 and 3. FIGS. 15B, 16B and 17B illustrate cross-sectional views of the TFT substrate along the line XV–XV' of FIG. 15A, the line XVI–XVI' of FIG. 16A and the line XVII–XVII' of FIG. 17A.

As shown in FIGS. 15A and 15B, a metal pattern of about 3,000 thickness is deposited and patterned to form a gate electrode 20, a gate line 21 and a storage capacitor electrode 30 on a transparent insulating substrate 10. A gate insulating layer 40, an a-Si layer 50, and a silicon nitride layer 60 are deposited thereon in sequence using CVD (chemical vapor deposition) method. The thickness of the gate insulating layer 40 is 3,000–6,000 Å, that of the a-Si layer 50 is 500–1,000 Å, and that of the silicon nitride layer 60 used as an etch stopper is 1,000–2,000 Å.

Then, a layer of photoresist is coated on the silicon nitride layer 60, and exposed to light from the rear side of the substrate 10 to form a photoresist pattern. The silicon nitride layer 60 is etched using the photoresist pattern as a mask to form an etch stopper layer 60.

Next, heavily doped n+ a-Si layer 71 and 72 is deposited and etched with the a-Si layer 50. Then, a metal pattern of about 3,000 Å thickness is deposited and patterned to form a source electrode 80, a drain electrode 90 and a data line 81, and the n+ a-Si layer 71 and 72 is etched using the source and the drain electrodes 80 and 90 and the data line 81 as a mask to form an ohmic contact layer 71 and 72.

Then, as shown in FIGS. 16A and 16B, a passivation layer 100 made of organic insulating material having low dielectric constant and high transmittance is coated by spin coating, and thereby the passivation layer 100 can have a flat surface. The dielectric constant of the passivation layer 100 is preferably 2.4–3.7, and its thickness is preferably 2.0–4.0 $\mu$m. A contact hole 130 exposing the drain electrode 90 and a trench 120 exposing the storage capacitor electrode 30 are formed by etching the passivation layer 100. The contact hole 130 and the trench 120 are formed by dry etching method using $O_2$, $SF_6$ and $CF_4$. In case that the organic insulating material is photo definable, only the steps of exposing using a mask and developing the passivation layer 100 may be performed.

Next, as illustrated in FIGS. 17A and 17B, an ITO layer is deposited and patterned to form a pixel electrode 140 in pixel region which is defined by the gate line 21 and the data line 81.

Finally, as shown in FIGS. 2 and 3, the passivation layer 100 is etched to a depth using the pixel electrode 140 as a mask, and organic black photoresist is filled in the groove in the passivation layer 100 to form a black matrix having a flat surface. The etching depth is 0.5–1.7 $\mu$m preferably, the surface resistance of the organic black photoresist is equal to or more than $10^{10}$ $\Omega/\square$. The optical density of the black matrix 110 is equal to or more than 2.5.

Referring now to FIGS. 4–6, methods of manufacturing liquid crystal displays having different storage capacitors will be described.

To manufacture the TFT substrate according to the second embodiment of the present invention, as shown in FIG. 4, after the passivation layer 100 is etched to make a trench 120, an exposed portion of the gate insulating layer 40 is dry etched. Therefore, the portion of the gate insulating layer 40 on the storage capacitor electrode 30 becomes thin and the storage capacitance becomes large. In this case, to etch the gate insulating layer 40 to a uniform depth, the gate insulating layer may include two layers which have large etching selectivity and only the upper layer may be removed.

To manufacture the TFT substrate according to the third embodiment of the present invention, as illustrated in FIG. 5, a portion of the gate insulating layer 40 on the storage capacitor electrode 30 is etched to form a contact hole 32 before depositing a metal layer for the data lines, the source and the drain electrodes. Then, a metal pattern 31 is formed on the portion of the gate insulating layer 40 on the storage capacitor electrode 30 simultaneously with a source electrode 80 and a drain electrode 90. The metal pattern 31 is connected to the storage capacitor electrode 30 through the contact hole 32.

To manufacture the TFT substrate according to the fourth embodiment of the present invention, as illustrated in FIG. 6, a metal pattern 31 is formed on the portion of the gate insulating layer 40 on the storage capacitor electrode 30 simultaneously with a source electrode 80 and a drain electrode 90. The metal pattern 31 is connected to the pixel electrode 140.

Figure 18:
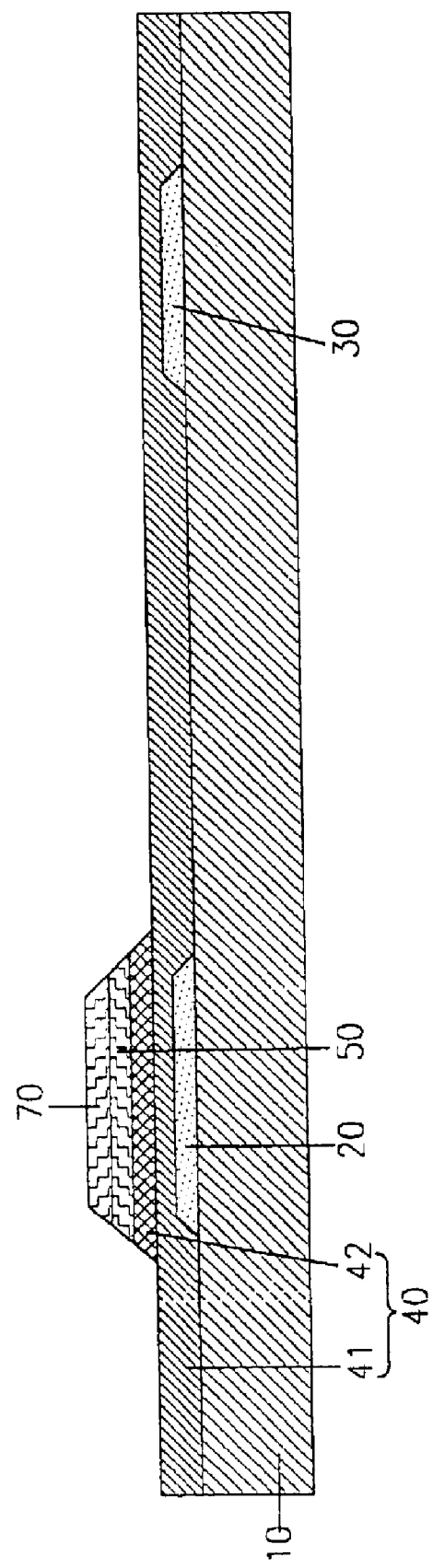
FIGS. 18 and 19 show cross-sectional views of intermediate structures illustrating a method of manufacturing the TFT substrate according to the sixth embodiment of the present invention.
Figure 19:
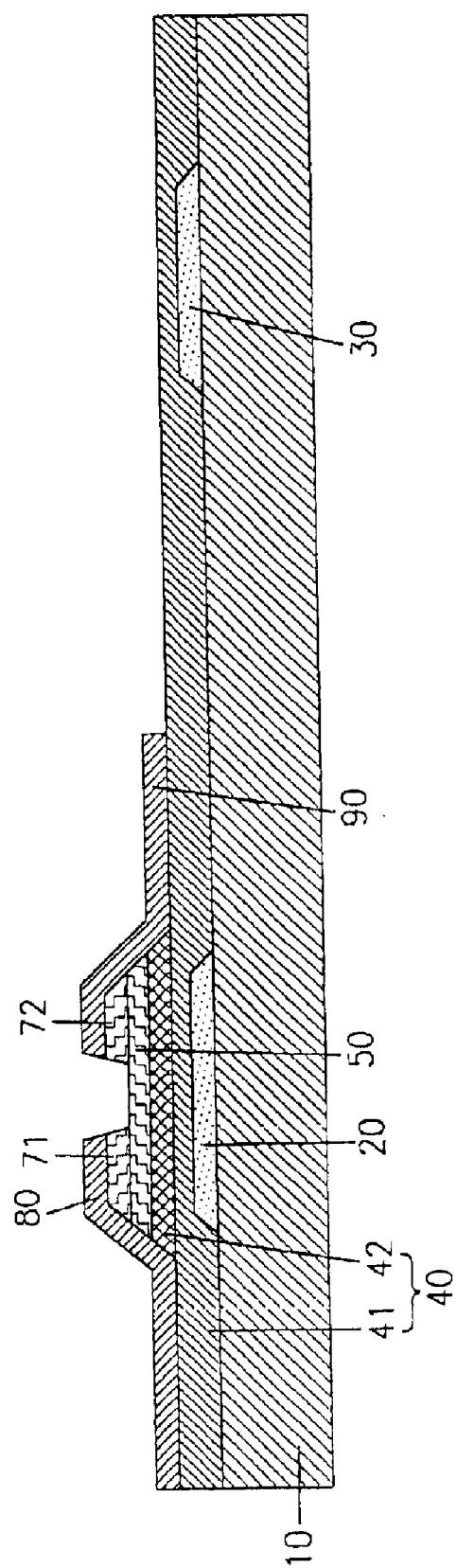

Then, referring to FIGS. 18 and 19, manufacturing method of a TFT substrate of the sixth embodiment shown in FIG. 8.

As illustrated in FIG. 18, an organic insulating layer 41 of 2,500–5,500 Å thickness is spin coated on a transparent insulating substrate 10 having a gate electrode 20, a gate line (not shown) and a storage capacitor electrode 30, and an SiNx layer 42 of 500–800 Å is deposited thereon using CVD (chemical vapor deposition) method. The organic insulating layer 41 and the SiNx layer 42 form a gate insulating layer 40. On the SiNx layer 42, an a-Si layer 50 and an n+ a-Si layer 70 are deposited in sequence. The thickness of the a-Si layer 50 is less than 1,000 Å.

Then, a layer of photoresist is formed and patterned. The n+ a-Si layer 70, the a-Si layer 50 and the SiNx layer 42 are etched in sequence using the photoresist pattern as a mask.

Next, as shown in FIG. 19, a metal pattern is deposited and patterned to form a source electrode 80, a drain electrode 90 and a data line (not shown), and the n+ a-Si layer 70 is etched using the source and the drain electrodes 80 and 90 and the data line as a mask to form an ohmic contact layer 71 and 72.

The remaining processes are similar to those of the manufacturing method of the TFT substrate of the first embodiment.

To manufacture the TFT substrate according to the seventh embodiment of the present invention, as illustrated in FIG. 9, a metal pattern 31 is formed on the portion of the gate insulating layer 40 on the storage capacitor electrode 30 when a source electrode 80 is formed. The metal pattern 31 is connected to the pixel electrode 140.

Figure 20:
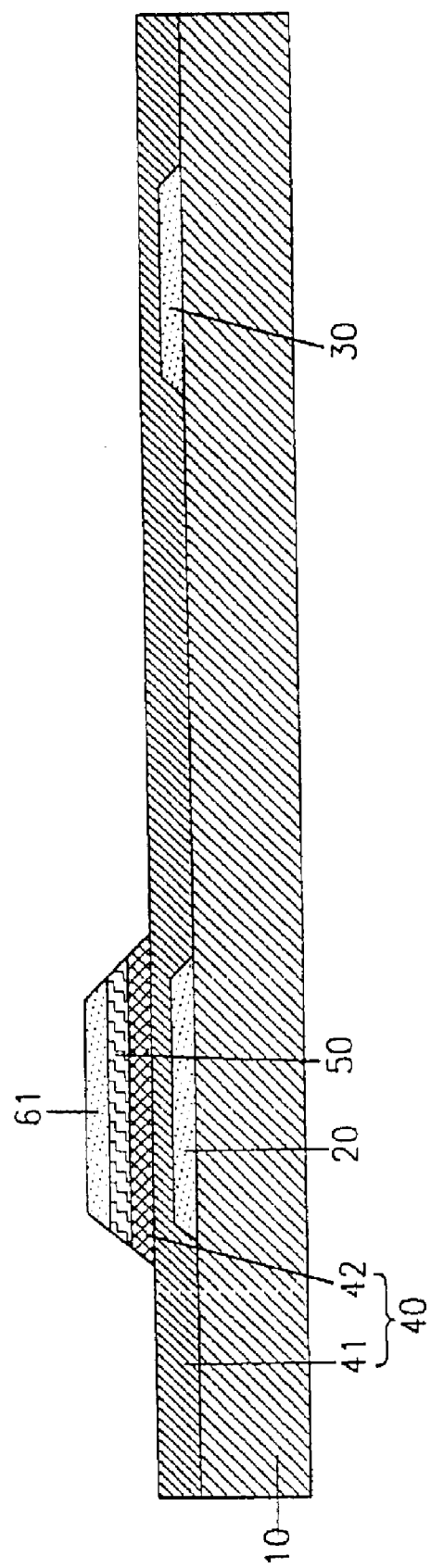
FIGS. 20 and 21 show cross-sectional views of intermediate structures illustrating a method of manufacturing the TFT substrate according to the eighth embodiment of the present invention.
Figure 21:
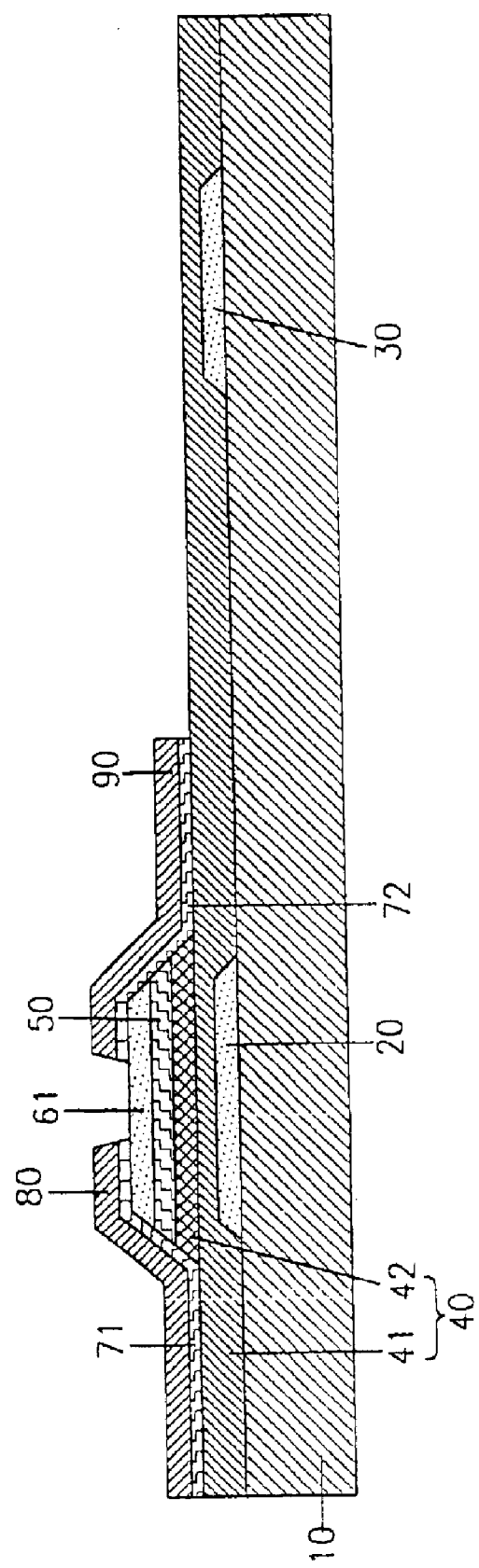

FIGS. 20 and 21 illustrate a manufacturing method of a TFT substrate of the eighth embodiment shown in FIG. 10.

As illustrated in FIG. 20, an organic insulating layer 41 of 2,500–5,500 thickness is spin coated on a transparent insulating substrate 10 having a gate electrode 20, a gate line (not shown) and a storage capacitor electrode 30, and an SiNx layer 42 of 500–800 Å is deposited using CVD (chemical vapor deposition) method. On the SiNx layer 42, an a-Si layer 50 of less than 1,000 Å thickness is deposited, and a layer of positive type photo definable organic material having the thickness of 3,000–5,000 Å is coated thereon. Photo BCB, photo definable acrylic polymer may be used as the organic material. Then, the substrate 10 is exposed to light from the rear side of the substrate 10 by the energy of 200–600 mJ (millijoule), and exposed to light again from the front side of the substrate 10 using a mask which exposes the portion of the organic insulating layer which becomes the etch stopper layer by the energy of 50–100 mJ. Next, the organic material layer is developed to form the etch stopper layer 61 and annealed under the $N_2$ environment at the temperature of 200–230° C.

Using the etch stopper layer 61 as a mask, the a-Si layer 50 and the SiNx layer 42 are etched. Next, an n+ a-Si layer and a metal layer is deposited and patterned to form a source electrode 80, a drain electrode 90, a data line (not shown), and the n+ a-Si layer 71 and 72 thereunder.

The remaining processes of the manufacturing method are similar to those of the manufacturing method of the TFT substrate of the first embodiment.

In the manufacturing method of the TFT substrate of the ninth embodiment, as illustrated in FIG. 11, the processes for forming TFT are similar to those of the manufacturing method of the TFT substrate of the eighth embodiment. The remaining processes are similar to those of the manufacturing method of the TFT substrate of the fourth embodiment.

Now, referring to FIG. 12, manufacturing method of a color filter substrate according to an embodiment of the present invention. As illustrated in FIG. 12, a layer of color resist is formed on a transparent substrate 150, and color filters 160 are formed using photo etching process for the color resist layer. A passivation layer 170 is formed on the color filters 160, and an ITO common electrode 180 is formed thereon.

Next, as shown in FIG. 13, an organic insulating layer is formed on the common electrode 180 and patterned to form column shaped spacers 190. The spacers 190 are placed on the TFT on the TFT substrate.

Finally, an empty liquid crystal cell is made by assembling the TFT substrate and the color filter substrate, liquid crystal materials are filled in the cell, and driving ICs are added to complete liquid crystal display, as shown in FIG. 13.

According to the present invention, since the black matrix is formed using the pixel electrode as an etching mask, the aperture ratio can be increased. In addition, since the passivation layer and/or the gate insulating layer are made of organic materials having flat surfaces, the height difference between patterns can be reduced.

In the case that the etch stopper layer is made of the organic insulating layer having low dielectric constant, the parasitic capacitance between the gate electrode and the drain electrode can be decreased.

On the other hand, because the spacers are formed using photo definable organic material, the positions of the spacers can be controlled. Accordingly, by placing the spacers at suitable positions, the uniformity of the cell gap can be obtained, and a decrease of the transmittance can be prevented.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A liquid crystal display (LCD), comprising:
   a first substrate;
   a switching element formed on the first substrate;
   a passivation layer formed over the first substrate and the switching element and having a substantially flat upper surface;
   a black matrix layer formed on the upper surface of the passivation layer;
   a spacer formed on the black matrix layer;
   a storage electrode formed on the substrate; and
   a recess formed in a portion of the passivation layer overlying the storage electrode;
   wherein a pixel electrode is formed on the recess.

2. The LCD of claim 1, wherein the passivation layer is formed of an organic material having a dielectric constant in a range between 2.4 and 3.7.

3. The LCD of claim 1, further comprising a groove formed on a portion of an upper surface of the passivation layer, wherein the black matrix layer is formed on the groove.

4. The LCD of claim 1, wherein the switching element comprises:
   a gate electrode formed on the substrate;
   a gate insulating layer formed on the gate electrode;
   a semiconductor layer formed on the gate insulating layer; and
   a source electrode and a drain electrode formed on the semiconductor layer,
   wherein the pixel electrode is connected to the drain electrode through the passivation layer.

5. The LCD of claim 4, wherein the semiconductor layer comprises:
   an amorphous silicon layer formed on the gate insulating layer; and
   an ohmic contact layer formed on the amorphous silicon layer.

6. The LCD of claim 5, wherein the semiconductor layer further comprises an etch stopper layer formed between the amorphous silicon layer and the ohmic contact layer.

7. The LCD of claim 4, wherein the gate insulating layer has a substantially flat upper surface.

8. The LCD of claim 1, wherein the recess is extended from the upper surface of the passivation layer to the gate insulating layer.

9. The LCD of claim 1, further comprising a conductive pattern formed a portion of the gate insulting layer overlying the storage electrode, wherein the recess is extended from the upper surface of the passivation layer to the conductive pattern.

10. The LCD of claim 1, further comprising:
    a second substrate facing the first substrate; and
    a plurality of color filters formed on the second substrate,
    wherein the spacer is disposed at a space between two color filters neighboring each other.

11. The LCD of claim 10, wherein the second substrate further comprises:
    a passivation layer formed on the color filters; and
    a common electrode formed on the passivation layer.

* * * * *